United States Patent
Davis et al.

[11] Patent Number: 5,907,253
[45] Date of Patent: May 25, 1999

[54] FRACTIONAL-N PHASE-LOCK LOOP WITH DELAY LINE LOOP HAVING SELF-CALIBRATING FRACTIONAL DELAY ELEMENT

[75] Inventors: Craig Davis; Jeff Huard, both of Puyallup, Wash.

[73] Assignee: National Semiconductor Corporation, Santa Clara, Calif.

[21] Appl. No.: 08/977,308

[22] Filed: Nov. 24, 1997

[51] Int. Cl.[6] .................................................. H03L 7/06
[52] U.S. Cl. ..................... 327/156; 327/158; 327/160; 331/DIG. 2; 331/44
[58] Field of Search ............................. 327/156, 158, 327/161, 160; 331/44, DIG. 2, 1 A; 375/376

[56] References Cited

U.S. PATENT DOCUMENTS

| | | | |
|---|---|---|---|
| 3,959,737 | 5/1976 | Tanis | 331/1 A |
| 4,926,447 | 5/1990 | Corsetto et al. | 375/120 |
| 5,012,198 | 4/1991 | Okada et al. | 328/155 |
| 5,334,952 | 8/1994 | Maddy et al. | 331/1 A |
| 5,394,444 | 2/1995 | Silvey et al. | 375/374 |
| 5,424,687 | 6/1995 | Fukuda | 331/11 |
| 5,451,910 | 9/1995 | Guthrie | 331/16 |
| 5,486,792 | 1/1996 | Girardeau, Jr. | 331/10 |
| 5,506,531 | 4/1996 | Jang et al. | 327/156 |
| 5,614,855 | 3/1997 | Lee et al. | 327/158 |
| 5,682,112 | 10/1997 | Fukushima | 327/147 |
| 5,696,468 | 12/1997 | Nise | 331/14 |

*Primary Examiner*—Timothy P. Callahan
*Assistant Examiner*—An T. Luu
*Attorney, Agent, or Firm*—Limbach & Limbach L.L.P.

[57] ABSTRACT

A fractional-N phase-lock loop (PLL) with a delay line loop (DLL) having a self-calibrating fractional delay element which controls the PLL feedback signal in such a manner that the delay intervals for the feedback signal are: increased when small fractional divisors (<½) causing a lagging phase relationship or large fractional divisors (>½) causing a leading phase relationship are sensed; and decreased when small fractional divisors (<½) causing a leading phase relationship or large fractional divisors (>½) causing a lagging phase relationship are sensed.

34 Claims, 5 Drawing Sheets

FRACTIONAL-N PHASE-LOCK LOOP WITH DELAY LINE LOOP HAVING SELF-CALIBRATING FRACTIONAL DELAY ELEMENT

BACKGROUND OF THE INVENTION

1. Field of the Invention

The present invention relates to fractional-N phase-lock loops (PLLs), and in particular, to fractional-N PLLs with a delay line loop (DLL).

2. Description of the Related Art

Figure 1:
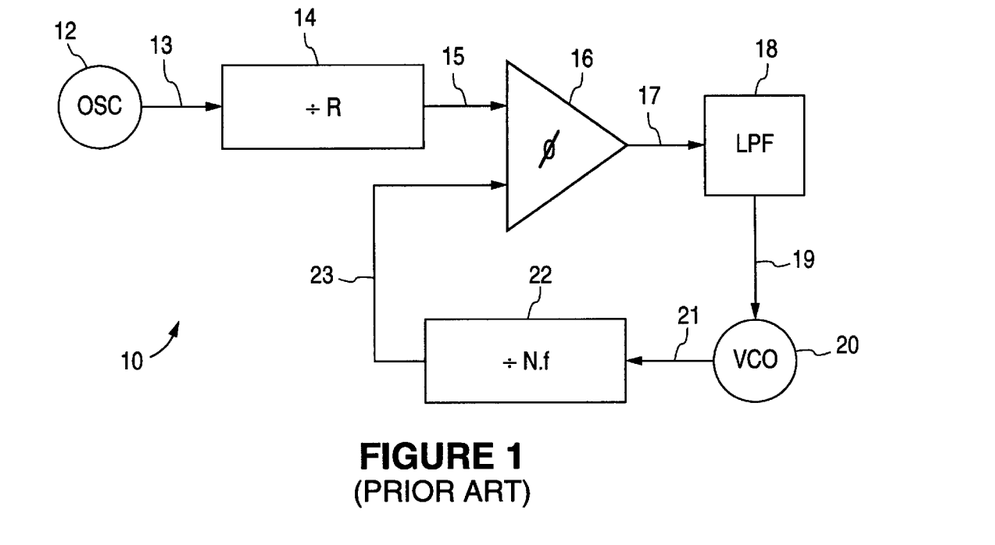
FIG. 1 is a functional block diagram of a conventional fractional-N PLL circuit.

Referring to FIG. 1, a fractional-N PLL is used to digitally synthesize signal frequencies using a non-integer counter 22 (integer plus fraction) in its feedback path. The fractional portion F of the counter 22 provides finer tuning resolution for a given reference frequency (originating from a reference oscillator 12) than an integer only counter. For a given tuning resolution, the fractional-N counter 22 has a smaller modulus than an integer counter and, therefore, results in faster phase lock and produces less close-in phase noise in the voltage-controlled oscillator (VCO) 20.

However, such fractional counters 22 have been notorious for generating undesirable spurious noise at the fractional frequencies. Spurious noise elements ("spurs") occurring at the fractional frequency rate are introduced, typically, as a result of either poorly calibrated fractional delays within the loop or voltage dithering in the loop filter 18 due to the PLL charge being distributed over time.

One of the more common methods for performing a fractional count is that of integer averaging. For example, in order to obtain a fractional modulus of N+¼ the counter 22 will divide by the modulus N for three successive cycles and then divide by N+1 for one cycle. At any given point in time, the instantaneous division is incorrect, but averaged over four cycles such division provides exactly N+¼. However, the three successive cycles of division by N cause the loop phase error to accumulate in one direction, while the fourth cycle of division by N+1 causes one large phase error in the opposite direction. While the desired average frequency is thus maintained, these "jumps" in phase nonetheless produce signals at spurious frequencies which are related to the reference frequency.

In another approach involving fractional-N counters, a variable amount of electrical charge is injected into the loop filter 18 during each cycle of the reference signal 15 in an attempt to null out charge imbalances and eliminate voltage dither within the loop filter 18. However, this technique still tends to dump into the filter 18 electrical charge which is spread over time and still results in some amount of voltage dithering.

Figure 2:
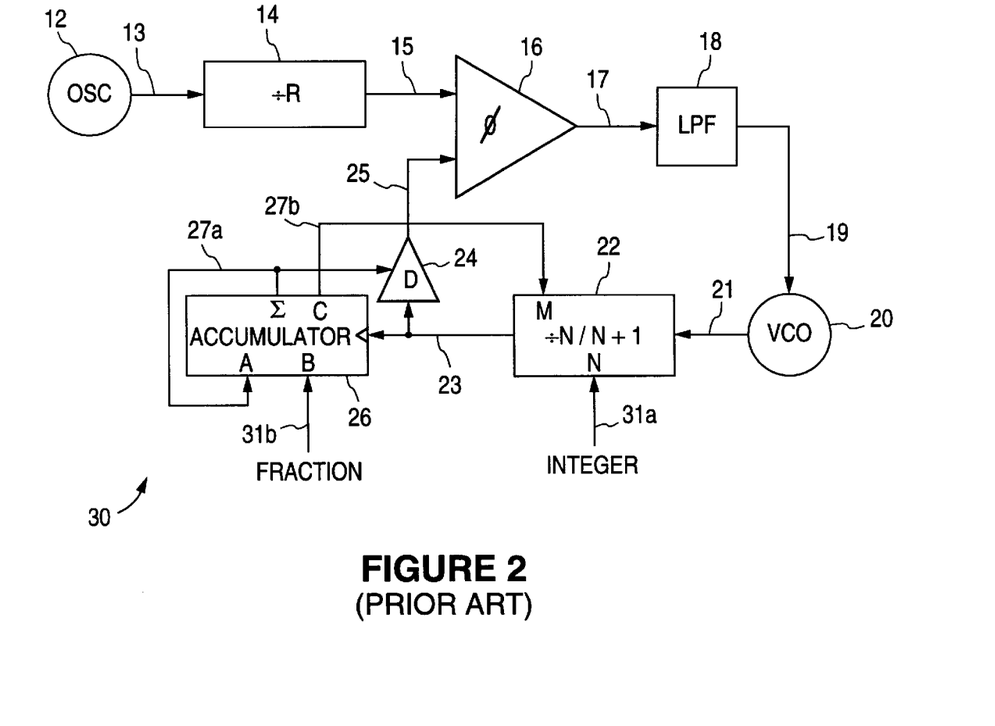
FIG. 2 is a functional block diagram of a conventional fractional-N PLL with variable delay within the feedback loop.

Referring to FIG. 2, another common fractional-N implementation adds a variable delay element 24 after the fractional-N counter 22 for supplementing the integer VCO delay steps. Since the counter 22 begins counting over each cycle without waiting for the output 25 of the delay element 24, each successive delay within the delay element 24 must be adjusted to cancel out the accumulated phase error. Delivery of a consistent N+¼ output period would require division by N for three consecutive cycles accompanied by additional delay of ¼, 2/4 and ¾ of a VCO output period, respectively, followed by a division by N+1 with no added delay ("0/4"). If each one of such delays is a properly calibrated fractional percentage of the integer VCO period, each successive cycle will then be aligned in phase with the signal 15 from the reference counter 14, thereby resulting in minimal tuning line dither being produced by the phase detector 16. However, maintaining such proper calibration of each of the supplemental delays is difficult to do consistently.

Figure 3:
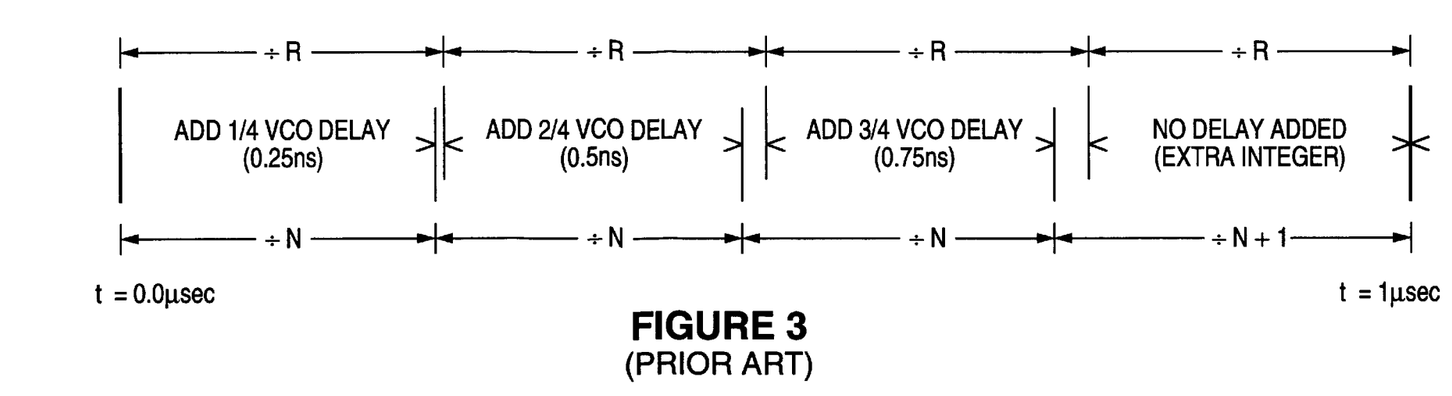
FIG. 3 illustrates the variable feedback signal delay provided by the circuit of FIG. 2.

Referring to FIG. 3, this technique can be represented as shown based upon a VCO signal period of one microsecond and corresponding delays of ¼ of a VCO output period or 0.25 nanoseconds. The accumulator 26, which is a 4-bit adder, sums its summation output 27a with the fractional information 31b and is clocked by the output 23 from the fractional-N counter 22. The carry output 27b of the accumulator 26 serves as the modulus control signal M for the counter 22, and instructs the counter 22 to add the one additional count when more than one full VCO period of phase lag has accumulated (thereby preventing the variable delay gate range from being exceeded). The summation signal 27a is also used to increment the delays within the delay element 24.

Figure 4:
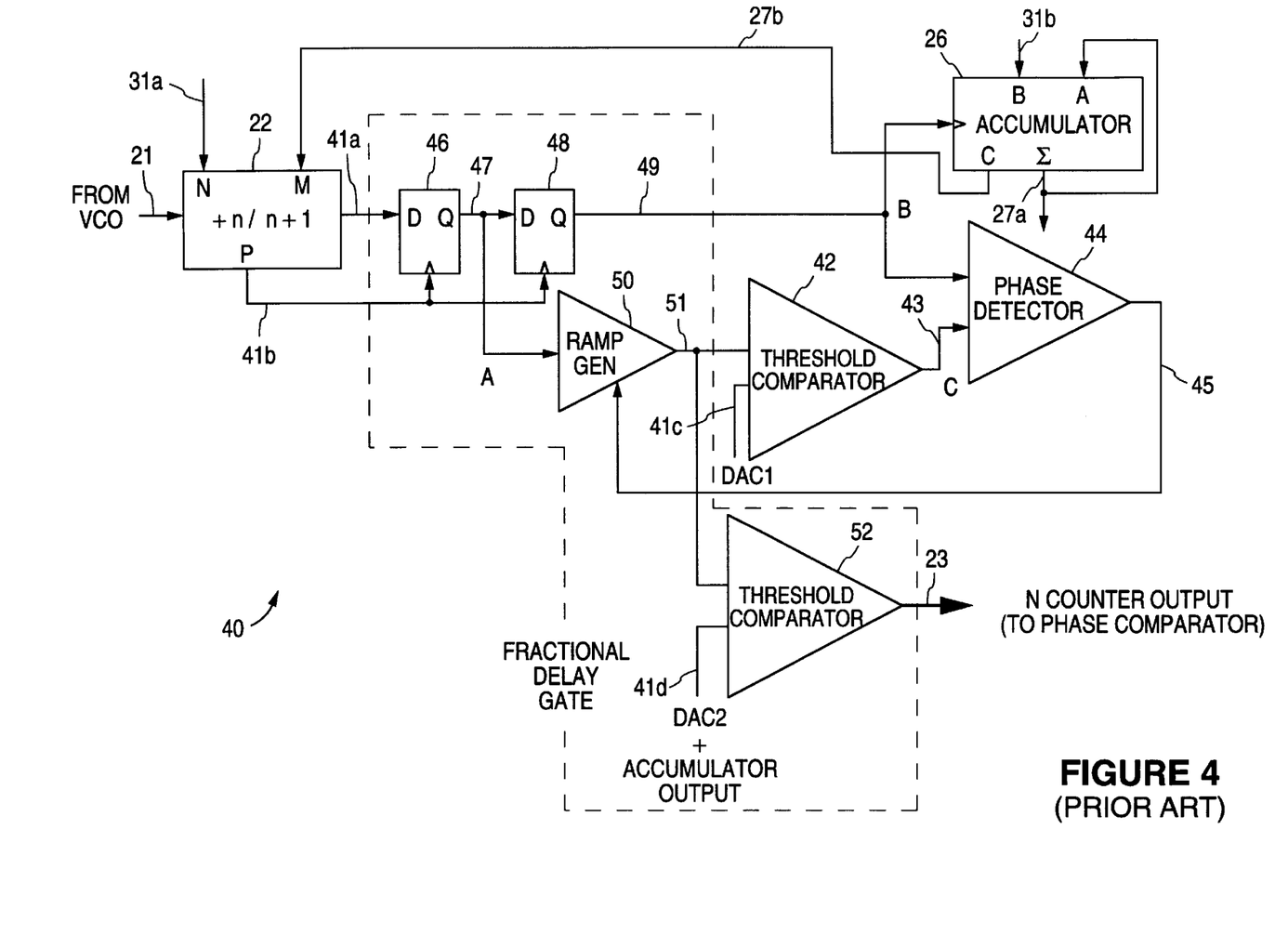
FIG. 4 is a functional block diagram of a conventional fractional-N PLL circuit with a DLL for calibrating the fractional delays within the feedback loop.

Referring to FIG. 4, one conventional technique for maintaining calibration of the fractional replicas of the VCO period is to use a frequency-divided output 41a of the VCO 20 (FIG. 1) as a time reference within a DLL. This signal 41a is frequency-divided by two D-type flip-flops 46, 48 which are clocked by the prescaler output 41b of the counter 22. The first flip-flop output 47 drives a ramp generator 50, while the second output 49 clocks the accumulator 26 and drives the DLL phase detector 44. The output 51 of the ramp generator 50 is compared against two threshold signals 41c, 41d in two threshold comparators 42, 52, with the first result signal 43 also driving the DLL phase detector 44 and the second result signal 23 driving the PLL phase detector 16.

The first threshold signal 41c is generated by a digital-to-analog converter (DAC) DAC1 (not shown). The second threshold signal 41d is generated by a circuit which sums the output of another DAC DAC2 with the output 27a from the accumulator 26.

The slope of the ramp signal 51 is modulated by a control signal 45 generated by the DLL phase detector 44 (by adjusting the value of the output from a constant current source which charges a capacitor within the ramp generator 50). When the input 47 to the ramp generator 50 is asserted, the ramp signal 51 rises at a constant rate beyond the threshold voltage 41c, thereby generating a pulse at the output 43 which is compared in phase to the frequency-divided VCO signal 49. This modulation feedback of the delay introduced by the ramp generator 50 forces the delay from node A to node C to equal the period of the prescaler output signal 41b.

The second threshold comparator 52 compares the ramp signal 51 to a threshold voltage 41d which is equal to or greater than the first threshold voltage 41c, depending upon the value of the summation output 27a from the accumulator 26. Hence, the corresponding delay in the phase of this comparator output 23 is modulated by the state of the output 27a from the accumulator 26.

Figure 5:
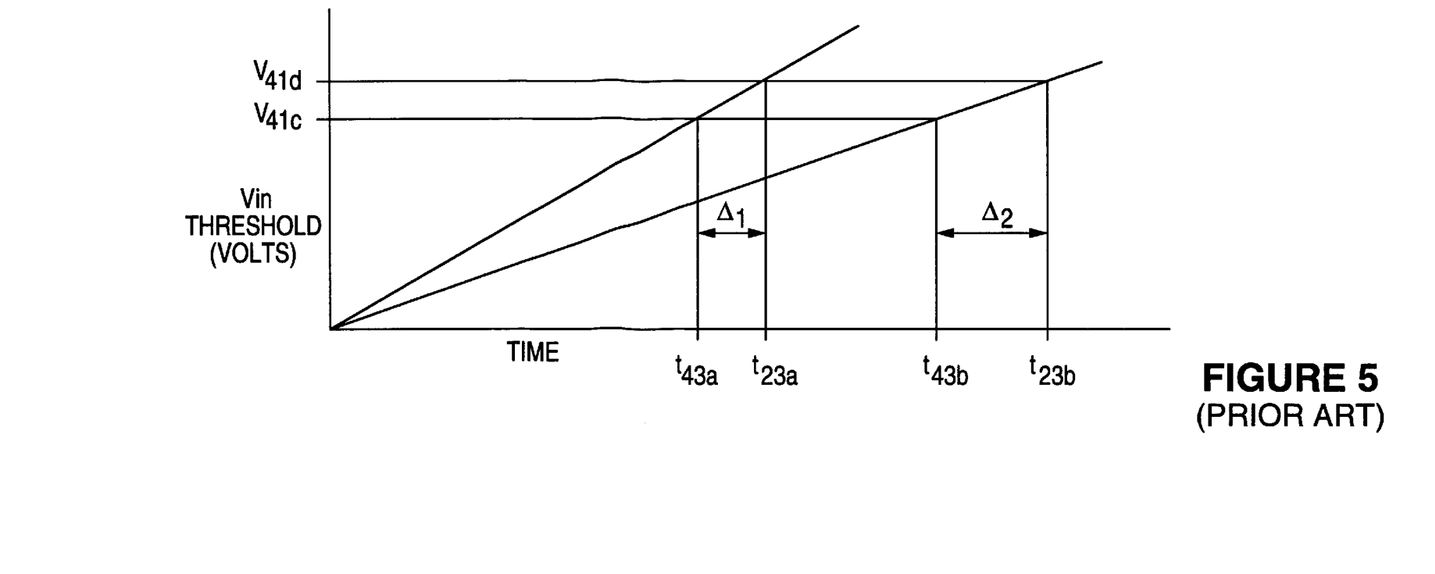
FIG. 5 is a graph illustrating the calibration concept for the circuit of FIG. 4.

Referring to FIG. 5, if a known calibration period $t_{43a}$ is established with the signal path set by threshold comparator 42, then an incremental change in the time delay ($\Delta_1 = t_{23a} - t_{43a}$) can be obtained which is proportional to the threshold voltages $41c$ ($V_{41c}$), $41d$ ($V_{41d}$) which are applied along the signal path as established by threshold comparator 52 ($t_{23a} = t_{43a} * V_{41d}/V_{41c}$).

While this circuit 40 provides for some calibration of the fractional VCO delay steps, a number of sources for errors still exist. For example, errors in matching the delay paths, e.g., the threshold comparators 42, 52, or errors in the symmetry of the charge pump within the DLL phase detector 44 will introduce fractional calibration errors.

Accordingly, it would be desirable to have a DLL which provides more accurate and consistent self-calibration of its fractional delays.

SUMMARY OF THE INVENTION

In accordance with the present invention, a fractional-N PLL with a DLL having a self-calibrating fractional delay element controls the PLL feedback signal in such a manner that the delay intervals for the feedback signal are: increased when small fractional divisors (<½) causing a lagging phase relationship or large fractional divisors (>½) causing a leading phase relationship are sensed; and decreased when small fractional divisors (<½) causing a leading phase relationship or large fractional divisors (>½) causing a lagging phase relationship are sensed.

A fractional-N PLL with a DLL having a self-calibrating fractional delay element in accordance with the present invention provides a number of advantages. For example, the self-calibration of the fractional delay element within the DLL requires only one comparator. This eliminates the need for multiple signal comparison thresholds which, in turn, eliminates reference frequency related signal spurs in the output due to mismatches within the comparison circuits. Additionally, phase comparisons can be performed at a faster rate which can be established independently of the period of the VCO output signal. This results in the PLL spending less time in an uncertain state which, in turn, results in less output signal phase noise.

A fractional-N PLL with a DLL having a self-calibrating fractional delay element in accordance with the present invention includes a PLL phase comparison circuit, an oscillator circuit and a DLL feedback circuit. The PLL phase comparison circuit is configured to receive and compare a PLL feedback signal having a PLL feedback signal phase with a PLL reference signal having a PLL reference signal phase and frequency and in accordance therewith provide a PLL control signal which represents a difference between the PLL feedback and reference signal phases. The oscillator circuit is coupled to the PLL phase comparison circuit and is configured to receive the PLL control signal and in accordance therewith provide a PLL output signal having a PLL output signal frequency which is M-times the PLL reference signal frequency. The DLL feedback circuit is coupled between the oscillator circuit and the PLL phase comparison circuit and is configured to receive and frequency-divide the PLL output signal by a factor of N+F and in accordance therewith provide the PLL feedback signal, wherein N is an integer and F is a fraction between zero and unity.

In accordance with one embodiment of the present invention, the DLL feedback circuit includes a DLL frequency divider circuit, a DLL delay circuit and a DLL phase comparison circuit. The DLL frequency divider circuit is coupled to the oscillator circuit and is configured to receive a frequency division control signal and in accordance therewith receive and frequency-divide the PLL output signal by the factor of N+F and in accordance therewith provide a frequency-divided signal. The DLL delay circuit is coupled to the DLL frequency divider circuit and is configured to receive a delay control signal and the frequency-divided signal and in accordance therewith provide the frequency division control signal, the PLL feedback signal and a DLL control signal, wherein the PLL feedback signal corresponds to the frequency-divided signal with a time delay in accordance with the delay control signal. The DLL phase comparison circuit is coupled to the DLL delay circuit and is configured to receive the DLL control signal and in accordance therewith receive and compare the PLL reference signal and the PLL feedback signal and in accordance therewith provide the delay control signal.

In accordance with another embodiment of the present invention, the DLL feedback circuit includes a DLL frequency divider circuit, a DLL delay circuit and a DLL control circuit. The DLL frequency divider circuit is coupled to the oscillator circuit and is configured to receive a frequency division control signal and in accordance therewith receive and frequency-divide the PLL output signal by the factor of N+F and in accordance therewith provide a frequency-divided signal. The DLL delay circuit is coupled to the DLL frequency divider circuit and is configured to receive a delay control signal and the frequency-divided signal and in accordance therewith provide the PLL feedback signal, wherein the PLL feedback signal corresponds to the frequency-divided signal with a time delay in accordance with the delay control signal. The DLL control circuit is coupled to the DLL frequency divider circuit and the DLL delay circuit and is configured to receive the frequency-divided signal and in accordance therewith receive and compare the PLL reference signal and the PLL feedback signal and in accordance therewith provide the frequency division control signal and the delay control signal.

These and other features and advantages of the present invention will be understood upon consideration of the following detailed description of the invention and the accompanying drawings.

BRIEF DESCRIPTION OF THE DRAWINGS

Throughout the figures, identical or corresponding numeric designators are used to identify identical or corresponding elements, respectively.

DETAILED DESCRIPTION OF THE INVENTION

Figure 6:
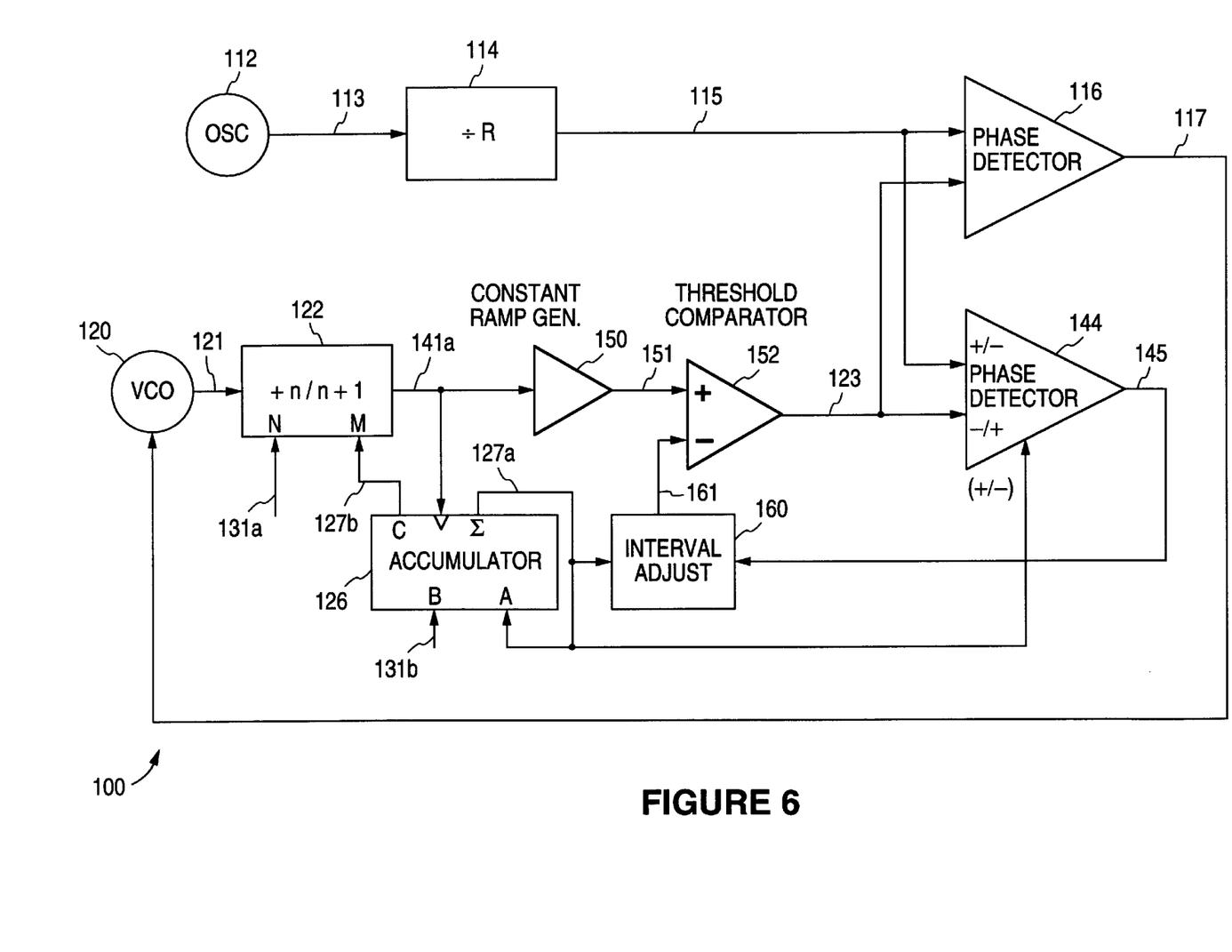
FIG. 6 is a functional block diagram of a fractional-N PLL with a DLL having a self-calibrating fractional delay element in accordance with one embodiment of the present invention.

Referring to FIG. 6, a fractional-N PLL 100 with a DLL having a self-calibrating fractional delay element in accordance with one embodiment of the present invention includes a reference signal source (e.g., oscillator) 112, a reference counter 114, a PLL phase detector 116, a controllable oscillator (e.g., VCO) 120, a fractional counter 122, a ramp generator 150, a comparator circuit 152, a DLL phase detector 144, an accumulator 126 and an interval adjustment circuit 160, all interconnected substantially as shown.

The terminal count output 141a of the fractional-N counter 122 clocks the accumulator 126 and drives the ramp generator 150. The carry output 127b of the accumulator 126 provides the modulus control signal M for the fractional-N counter 122, which also receives a control signal 131A which determines the modulus N. The summation output 127a of the accumulator 126 is summed with the signal 131b identifying the fractional divisor F, and is used to control the DLL phase detector 144 (discussed further below).

The interval adjustment circuit 160 uses the summation output 127a and the phase detector output 145 to generate a threshold voltage 161 for the comparator circuit 152 (discussed further below). The output 123 of the comparator 152 is compared with the frequency-divided reference signal 115 in both the PLL phase detector 116 and the DLL phase detector 144. The output 117 of the PLL phase detector 116 controls the oscillator 120. (Although not expressly shown here, a low pass loop filter is generally also included between the PLL phase detector 116 and oscillator 120 for low pass filtering of the PLL control signal 117.)

Figure 7:
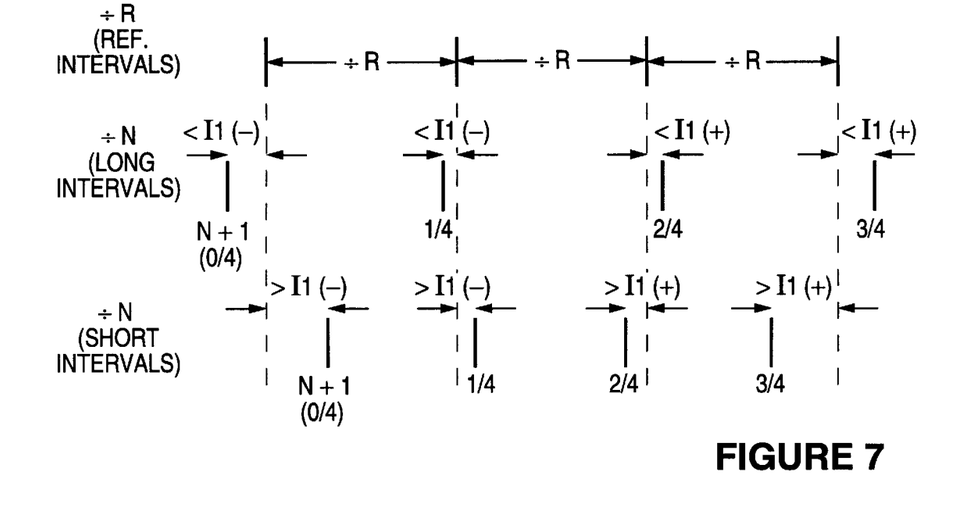
FIG. 7 illustrates the self-calibration concept for the circuit of FIG. 6.

Referring to FIG. 7, the PLL 100 of FIG. 6 takes advantage of the fact that the PLL 100 settles into phase-lock by "averaging" the sequence of phase edges of the signal 123 from the DLL. If the fractional delay component within the DLL has a monotonically long delay error, then all of the fractional delay components with a value of less than ½ will occur early relative to the phase edges of the divided reference signal 115, while those components with values greater than ½ will occur late. Conversely, if the fractional delay component has a monotonically short delay error, then all of the fractional delay components with values of less than ½ will occur late relative to the phase edges of the divided reference signal 115, while those components having values greater than ½ will occur early. (It should be noted that "I1"=delay interval current source, and "(+/−)"= phase detector input polarity reference.)

The PLL 100 of FIG. 6 uses this information to control the feedback signal 141a into the fractional delay generator which includes the ramp generator 150, the comparator 152, the DLL phase detector 144, the accumulator 126 and the interval adjustment circuit 160. Such information is used to increase the delay intervals when the fractional delay generator senses small fraction members (less than ½) which cause a lagging phase relationship, or senses large fraction members (greater than ½) which cause a leading phase relationship. Similarly, the fractional delay generator decreases the delay intervals small fraction members which cause a leading phase relationship are sensed, or large fraction members which cause a lagging phase relationship are sensed.

The primary PLL portion of the PLL 100 also makes phase corrections based upon the same feedback 123 and reference 115 signal phase edges as the DLL portion. While the primary loop feedback path minimizes the average frequency (or phase) error, the DLL feedback path minimizes the periodic fractional phase errors. It is important to the stability of such a multi-loop system that the two loop feedback responses not interfere with one another. For example, the DLL feedback must not disturb the averaging efforts of the main PLL loop. To achieve this, the DLL must ensure that any corrections it makes to alter the fractional delay intervals push as many phase edges ahead in time as are pushed back in time. Hence, if the DLL needs to increase the fractional delay intervals, the smaller fractions must get pushed back in "absolute" time, while the larger fractions must get pushed later in "absolute" time. This is in contrast to the delay technique of the conventional circuit of FIG. 4 in which all delays are moved together either back or forward in time relative to the starting point of the ramp voltage.

Referring back to FIG. 5, the ramp circuit method used in the circuit of FIG. 4 cannot increase or decrease the difference between the "endpoints" of the time delay (i.e., times $t_{43a}$ and $t_{43b}$ and times $t_{23a}$ and $t_{23b}$ which may represent fraction selection tap points ¼ and ¾) without moving them both in or out in absolute time.

The terminal count signal 141a drives the constant ramp generator 150 such that the voltage of the output signal 151 ramps from a minimum value (e.g., VSS) to a maximum value (e.g., VDD) at a constant rate during the assertion period of the input signal 141a. In accordance with the summation signal 127a from the accumulator 126 and the DLL phase detector output signal 145, the interval adjustment circuit 160 (discussed in more detail below) provides and adjusts the threshold voltage 161 against which the ramp voltage 151 is compared by the comparator 152. Accordingly, a pulsed signal 123 is provided with an adjustable phase controlled by the DLL. The state of the summation signal 127a determines the relative polarity reference for the reference 115 and feedback 123 signals when compared within the DLL phase detector 144. This, in turn, determines the polarity of any changes in the phase detector output signal 145 used to control the interval adjustment circuit 160.

Figure 8:
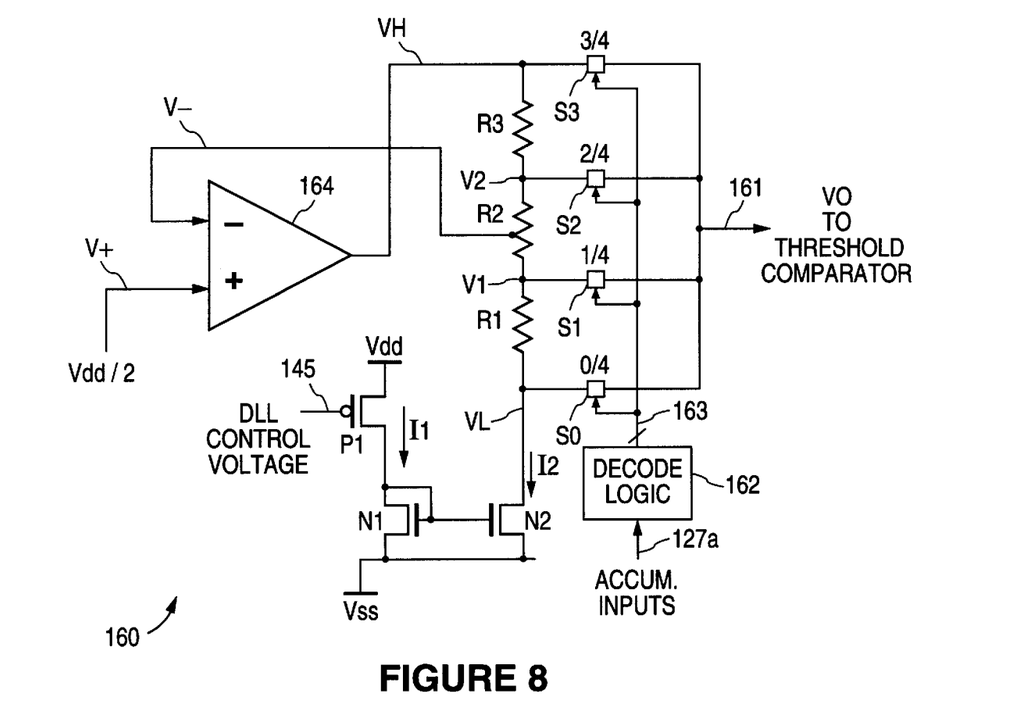
FIG. 8 is a schematic and functional block diagram of one embodiment of the delay interval adjustment circuit of FIG. 6.

Referring to FIG. 8, an interval adjustment circuit 160 in accordance with one embodiment of the present invention includes a PMOS transistor P1 which is driven by the DLL phase detector output signal 145 to produce a current I1 which is mirrored as an output current I2 by a simple current mirror circuit composed of two NMOS transistors N1, N2. This mirrored current I2 generates a voltage across the resistors R1, R2, R3 in a resistive voltage divider which is biased between a "high" voltage potential VH and a "low" voltage potential VL. The "high" voltage potential VH is established by the output of an operational amplifier 164 which compares the voltage V− at the midpoint of the voltage divider circuit to a reference voltage V+ which is equal to half of the power supply potential VDD. Hence, as the input control voltage 145 increases and decreases, currents I1 and I2 decrease and increase, respectively, thereby causing voltage divider biasing potential VL to increase and decrease, respectively, and voltage divider biasing potential VH to increase and decrease, respectively.

The summation signal 127a from the accumulator 126 drives a decode logic circuit 162 which generates a set of switch control signals 163 for determining which of the switches S0, S1, S2, S3 is closed, thereby causing the appropriate voltage (VL, V1, V2 or VH) to appear as the threshold voltage 161 for the comparator circuit 152. The increases and decreases in the current I2 driving the resistive voltage divider cause the voltages VL, V1, V2, VH to vary about the midpoint voltage V−. These variations in voltages, or voltage offsets, translate into time delay offsets by the action of the comparator circuit 152.

Various other modifications and alterations in the structure and method of operation of this invention will be apparent to those skilled in the art without departing from the scope and spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a fractional-N phase-lock loop (PLL) with a delay line loop (DLL) having a self-calibrating fractional delay element, comprising:

a PLL phase comparison circuit configured to receive and compare a PLL feedback signal having a PLL feedback signal phase with a PLL reference signal having a PLL reference signal phase and frequency and in accordance therewith provides a PLL control signal which represents a difference between said PLL feedback and reference signal phases;

an oscillator circuit, coupled to said PLL phase comparison circuit, configured to receive said PLL control signal and in accordance therewith provides a PLL output signal having a PLL output signal frequency which is M-times said PLL reference signal frequency; and a DLL feedback circuit, coupled between said oscillator circuit and said PLL phase comparison circuit, configured to receives and frequency-divide said PLL output signal by a factor of N+F and in accordance therewith provides said PLL feedback signal, wherein N is an integer, F is a fraction between zero and unity, and said DLL feedback circuit includes a DLL frequency divider circuit, coupled to said oscillator circuit, configured to receive a frequency division control signal and in accordance therewith receives and frequency-divides said PLL output signal by said factor of N+F and in accordance therewith provides a frequency-divided signal, a DLL delay circuit, coupled to said DLL frequency divider circuit, configured to receive a delay control signal and said frequency-divided signal and in accordance therewith provides said frequency division control signal, said PLL feedback signal and a DLL control signal, wherein said PLL feedback signal corresponds to said frequency-divided signal with a time delay in accordance with said delay control signal, and a DLL phase comparison circuit, coupled to said DLL delay circuit, configured to receive said DLL control signal and in accordance therewith receives and compares said PLL reference signal and said PLL feedback signal and in accordance therewith provides said delay control signal.

2. The apparatus of claim 1, wherein said PLL phase comparison circuit comprises a phase detector.

3. The apparatus of claim 1, wherein said oscillator circuit comprises a voltage-controlled oscillator.

4. The apparatus of claim 1, wherein said DLL frequency divider circuit comprises a dual modulus prescaler circuit.

5. The apparatus of claim 1, wherein said DLL delay circuit comprises:

a signal delay circuit configured to receive a DLL reference signal and said frequency-divided signal and in accordance therewith provides said PLL feedback signal; and a delay control circuit, coupled to said signal delay circuit, configured to receive said delay control signal and said frequency-divided signal and in accordance therewith provides said frequency division control signal, said DLL reference signal and said DLL control signal.

6. The apparatus of claim 5, wherein said signal delay circuit comprises:

a ramp signal generator circuit configured to receive said frequency-divided signal and in accordance therewith provides a ramp signal; and a signal comparison circuit, coupled to said ramp signal generator circuit, configured to receive and compare said ramp signal and said DLL reference signal and in accordance therewith provides said PLL feedback signal.

7. The apparatus of claim 6, wherein said signal comparison circuit comprises a voltage comparator.

8. The apparatus of claim 5, wherein said delay control circuit comprises:

an accumulation circuit configured to receive said frequency-divided signal and in accordance therewith generates an accumulated count and in accordance therewith provide said frequency division control signal and said DLL control signal; and a reference signal generator circuit, coupled to said accumulation circuit, configured to receive said delay control signal and said DLL control signal and in accordance therewith provides said DLL reference signal.

9. The apparatus of claim 8, wherein said accumulation circuit comprises a counter.

10. The apparatus of claim 8, wherein said reference signal generator circuit comprises a programmable voltage generator configured to receive said delay control signal and said DLL control signal and in accordance therewith provides a programmable voltage as said DLL reference signal.

11. The apparatus of claim 1, wherein said DLL phase comparison circuit comprises a phase detector.

12. An apparatus including a fractional-N phase-lock loop (PLL) with a delay line loop (DLL) having a self-calibrating fractional delay element, comprising:

a PLL phase comparison circuit configured to receive and compare a PLL feedback signal having a PLL feedback signal phase with a PLL reference signal having a PLL reference signal phase and frequency and in accordance therewith provides a PLL control signal which represents a difference between said PLL feedback and reference signal phases;

an oscillator circuit, coupled to said PLL phase comparison circuit, configured to receive said PLL control signal and in accordance therewith provides a PLL output signal having a PLL output signal frequency which is M-times said PLL reference signal frequency; and a DLL feedback circuit, coupled between said oscillator circuit and said PLL phase comparison circuit, configured to receive and frequency-divide said PLL output signal by a factor of N+F and in accordance therewith provides said PLL feedback signal, wherein N is an integer, F is a fraction between zero and unity, and said DLL feedback circuit includes a DLL frequency divider circuit, coupled to said oscillator circuit, configured to receive a frequency division control signal and in accordance therewith receives and frequency-divides said PLL output signal by said factor of N+F and in accordance therewith provides a frequency-divided signal, a DLL delay circuit, coupled to said DLL frequency divider circuit, configured to receive a delay control signal and said frequency-divided signal and in accordance therewith provides said PLL feedback signal, wherein said PLL feedback signal corresponds to said frequency-divided signal with a time delay in accordance with said delay control signal, and a DLL control circuit, coupled to said DLL frequency divider circuit and said DLL delay circuit, configured to receive said frequency-divided signal and in accordance therewith receives and compares said PLL reference signal and said PLL feedback signal and in accordance therewith provides said frequency division control signal and said delay control signal.

13. The apparatus of claim 12, wherein said PLL phase comparison circuit comprises a phase detector.

14. The apparatus of claim 12, wherein said oscillator circuit comprises a voltage-controlled oscillator.

15. The apparatus of claim 12, wherein said DLL frequency divider circuit comprises a dual modulus prescaler circuit.

16. The apparatus of claim 12, wherein said DLL delay circuit comprises:

a ramp signal generator circuit configured to receive said frequency-divided signal and in accordance therewith provides a ramp signal; and a signal comparison circuit, coupled to said ramp signal generator circuit, configured to receive and compare said ramp signal and said delay control signal and in accordance therewith provides said PLL feedback signal.

17. The apparatus of claim 16, wherein said signal comparison circuit comprises a voltage comparator.

18. The apparatus of claim 12, wherein said DLL control circuit comprises:

an accumulation circuit configured to receive said frequency-divided signal and in accordance therewith generates an accumulated count and in accordance therewith provides said frequency division control signal and a first DLL control signal; and a delay control circuit, coupled to said accumulation circuit, configured to receive said first DLL control signal and in accordance therewith receives and compares said PLL reference signal and said PLL feedback signal and provides said delay control signal.

19. The apparatus of claim 18, wherein said accumulation circuit comprises a counter.

20. The apparatus of claim 18, wherein said delay control circuit comprises:

a DLL phase comparison circuit configured to receive said first DLL control signal and in accordance therewith receives and compares said PLL reference signal and said PLL feedback signal and provides a second DLL control signal; and a reference signal generator circuit, coupled to said DLL phase comparison circuit, configured to receive said first and second DLL control signals and in accordance therewith provides said delay control signal.

21. The apparatus of claim 20, wherein said DLL phase comparison circuit comprises a phase detector.

22. The apparatus of claim 20, wherein said reference signal generator circuit comprises a programmable voltage generator configured to receive said first and second DLL control signals and in accordance therewith provides a programmable voltage as said delay control signal.

23. A method of generating a fractional-N phase-locked signal using a delayed feedback signal with a self-calibrating fractional delay, comprising the steps of:

receiving and comparing a PLL feedback signal having a PLL feedback signal phase with a PLL reference signal having a PLL reference signal phase and frequency and in accordance therewith generating a PLL control signal which represents a difference between said PLL feedback and reference signal phases;

receiving said PLL control signal and in accordance therewith generating a PLL output signal having a PLL output signal frequency which is M-times said PLL reference signal frequency; and frequency-dividing said PLL output signal by a factor of N+F and in accordance therewith generating said PLL feedback signal, wherein N is an integer and F is a fraction between zero and unity, by performing the steps of receiving a frequency division control signal and in accordance therewith receiving and frequency-dividing said PLL output signal by said factor of N+F and in accordance therewith generating a frequency-divided signal, receiving a delay control signal and said frequency-divided signal and in accordance therewith generating said frequency division control signal, said PLL feedback signal and a DLL control signal, wherein said PLL feedback signal corresponds to said frequency-divided signal with a time delay in accordance with said delay control signal, and receiving said DLL control signal and in accordance therewith receiving and comparing said PLL reference signal and said PLL feedback signal and in accordance therewith generating said delay control signal.

24. The method of claim 23, wherein said step of receiving a frequency division control signal and in accordance therewith receiving and frequency-dividing said PLL output signal by said factor of N+F and in accordance therewith generating a frequency-divided signal comprises prescaling said PLL output signal in accordance with a dual modulus.

25. The method of claim 23, wherein said step of receiving a delay control signal and said frequency-divided signal and in accordance therewith generating said frequency division control signal, said PLL feedback signal and a DLL control signal comprises:

receiving a DLL reference signal and said frequency-divided signal and in accordance therewith generating said PLL feedback signal; and receiving said delay control signal and said frequency-divided signal and in accordance therewith generating said frequency division control signal, said DLL reference signal and said DLL control signal.

26. The method of claim 25, wherein said step of receiving a DLL reference signal and said frequency-divided signal and in accordance therewith generating said PLL feedback signal comprises:

receiving said frequency-divided signal and in accordance therewith generating a ramp signal; and comparing said ramp signal and said DLL reference signal and in accordance therewith generating said PLL feedback signal.

27. The method of claim 25, wherein said step of receiving said delay control signal and said frequency-divided signal and in accordance therewith generating said frequency division control signal, said DLL reference signal and said DLL control signal comprises:

receiving said frequency-divided signal and in accordance therewith generating an accumulated count and in accordance therewith generating said frequency division control signal and said DLL control signal; and receiving said delay control signal and said DLL control signal and in accordance therewith generating said DLL reference signal.

28. The method of claim 30, wherein said step of receiving said delay control signal and said DLL control signal and in accordance therewith generating said DLL reference signal comprises generating a programmable voltage as said DLL reference signal in accordance with said delay control signal and said DLL control signal.

29. A method of generating a fractional-N phase-locked signal using a delayed feedback signal with a self-calibrating fractional delay, comprising the steps of:

receiving and comparing a PLL feedback signal having a PLL feedback signal phase with a PLL reference signal having a PLL reference signal phase and frequency and in accordance therewith generating a PLL control signal which represents a difference between said PLL feedback and reference signal phases;

receiving said PLL control signal and in accordance therewith generating a PLL output signal having a PLL output signal frequency which is M-times said PLL reference signal frequency; and frequency-dividing said PLL output signal by a factor of N+F and in accordance therewith generating said PLL feedback signal, wherein N is an integer and F is a fraction between zero and unity, by performing the steps of receiving a frequency division control signal and in accordance therewith receiving and frequency-dividing said PLL output signal by said factor of N+F and in accordance therewith generating a frequency-divided signal, receiving a delay control signal and said frequency-divided signal and in accordance therewith generating said PLL feedback signal, wherein said PLL feedback signal corresponds to said frequency-divided signal with a time delay in accordance with said delay control signal, and receiving said frequency-divided signal and in accordance therewith receiving and comparing said PLL reference signal and said PLL feedback signal and in accordance therewith generating said frequency division control signal and said delay control signal.

30. The method of claim 29, wherein said step of receiving a frequency division control signal and in accordance therewith receiving and frequency-dividing said PLL output signal by said factor of N+F and in accordance therewith generating a frequency-divided signal comprises prescaling said PLL output signal in accordance with a dual modulus.

31. The method of claim 29, wherein said step of receiving a delay control signal and said frequency-divided signal and in accordance therewith generating said PLL feedback signal comprises:

receiving said frequency-divided signal and in accordance therewith generating a ramp signal; and comparing said ramp signal and said delay control signal and in accordance therewith generating said PLL feedback signal.

32. The method of claim 29, wherein said step of receiving said frequency-divided signal and in accordance therewith receiving and comparing said PLL reference signal and said PLL feedback signal and in accordance therewith generating said frequency division control signal and said delay control signal comprises:

receiving said frequency-divided signal and in accordance therewith generating an accumulated count and in accordance therewith generating said frequency division control signal and a first DLL control signal; and receiving said first DLL control signal and in accordance therewith receiving and comparing said PLL reference signal and said PLL feedback signal and generating said delay control signal.

33. The method of claim 32, wherein said step of receiving said first DLL control signal and in accordance therewith receiving and comparing said PLL reference signal and said PLL feedback signal and generating said delay control signal comprises:

receiving said first DLL control signal and in accordance therewith receiving and comparing said PLL reference signal and said PLL feedback signal and generating a second DLL control signal; and receiving said first and second DLL control signals and in accordance therewith generating said delay control signal.

34. The method of claim 33, wherein said step of receiving said first and second DLL control signals and in accordance therewith generating said delay control signal comprises generating a programmable voltage as said delay control signal in accordance with said first and second DLL control signals.

\* \* \* \* \*